(12) United States Patent
Koshimizu (10) Patent No.: US 12,334,305 B2
(45) Date of Patent: Jun. 17, 2025

(54) PLASMA PROCESSING APPARATUS

(71) Applicant: Tokyo Electron Limited, Tokyo (JP)

(72) Inventor: Chishio Koshimizu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 351 days.

(21) Appl. No.: 17/190,552

(22) Filed: Mar. 3, 2021

(65) Prior Publication Data

US 2021/0296093 A1 Sep. 23, 2021

(30) Foreign Application Priority Data

Mar. 17, 2020 (JP) ................................ 2020-046282

(51) Int. Cl.
*H01L 21/00* (2006.01)
*H01J 37/32* (2006.01)

(52) U.S. Cl.
CPC .. *H01J 37/32174* (2013.01); *H01J 37/32568* (2013.01); *H01J 37/32642* (2013.01); *H01J 37/32715* (2013.01)

(58) Field of Classification Search
CPC ................................................. H01J 37/32027
See application file for complete search history.

(56) References Cited

U.S. PATENT DOCUMENTS

| 5,928,528 A * | 7/1999 | Kubota | H01J 37/32706 257/E21.252 |
| 6,187,685 B1 * | 2/2001 | Hopkins | H01L 21/30655 438/719 |
| 11,532,456 B2 * | 12/2022 | Koshimizu | H01J 37/32935 |
| 2006/0196605 A1 * | 9/2006 | Ikegami | H01J 37/32082 118/728 |
| 2008/0236492 A1 * | 10/2008 | Yamazawa | H01J 37/32183 118/723 I |
| 2009/0026170 A1 * | 1/2009 | Tanaka | H01J 37/32091 216/60 |
| 2009/0194508 A1 | 8/2009 | Ui et al. | |
| 2010/0273332 A1 * | 10/2010 | Edelberg | H01J 37/32146 156/345.24 |
| 2011/0031217 A1 * | 2/2011 | Himori | H01J 37/32091 156/345.48 |

(Continued)

FOREIGN PATENT DOCUMENTS

| JP | 2019-036658 A | 3/2019 |
| KR | 10-0892790 B1 | 4/2009 |
| KR | 10-2018-0084647 A | 7/2018 |

*Primary Examiner* — Sylvia MacArthur
*Assistant Examiner* — Michelle Crowell
(74) *Attorney, Agent, or Firm* — Studebaker Brackett PLLC (57) ABSTRACT

A disclosed plasma processing apparatus includes a substrate support. The substrate support has a first region configured to support a substrate and a second region configured to support an edge ring. The first electrode is provided in the first region. The second electrode is provided in the second region. The first bias power source is connected to the first electrode via the first circuit. The second bias power source is connected to the second electrode via the second circuit. The second circuit has impedance higher than impedance of the first circuit at a common bias frequency of a first electrical bias generated by the first bias power source and a second electrical bias generated by the second bias power source.

20 Claims, 9 Drawing Sheets

(56) References Cited

U.S. PATENT DOCUMENTS

| | | | | |
|---|---|---|---|---|
| 2011/0253672 | A1* | 10/2011 | Kamibayashi | H01J 37/32091 216/61 |
| 2011/0281438 | A1* | 11/2011 | Lee | H01L 21/32136 438/720 |
| 2015/0076112 | A1* | 3/2015 | Sriraman | H01J 37/32422 156/345.28 |
| 2018/0082824 | A1* | 3/2018 | Likhanskii | H01J 37/32935 |
| 2018/0204757 | A1* | 7/2018 | Fushimi | H01J 37/32174 |
| 2019/0088520 | A1* | 3/2019 | Kraus | H01J 37/32715 |
| 2020/0135527 | A1* | 4/2020 | Sung | H01J 37/32642 |
| 2020/0185193 | A1* | 6/2020 | Koshimizu | H01J 37/32577 |
| 2020/0219701 | A1* | 7/2020 | Koshimizu | H01J 37/32642 |
| 2020/0266088 | A1* | 8/2020 | Kosakai | H01L 21/67098 |
| 2020/0402777 | A1* | 12/2020 | Sasaki | H01J 37/32091 |
| 2021/0074524 | A1* | 3/2021 | Koshimizu | H01J 37/32724 |
| 2021/0098239 | A1* | 4/2021 | Tamura | H01J 37/32715 |
| 2021/0305025 | A1* | 9/2021 | Tamura | H01L 21/6833 |
| 2022/0108878 | A1* | 4/2022 | Koshimizu | H01J 37/32715 |
| 2022/0384150 | A1* | 12/2022 | Koshimizu | H01J 37/32183 |
| 2023/0050506 | A1* | 2/2023 | Koshimizu | H01J 37/32642 |

* cited by examiner

PLASMA PROCESSING APPARATUS

CROSS-REFERENCE TO RELATED APPLICATIONS

This application is based on and claims the benefit of priority from Japanese Patent Application No. 2020-046282 filed on Mar. 17, 2020, the entire contents of which are incorporated herein by reference.

FIELD

Exemplary embodiments of the present disclosure relate to a plasma processing apparatus.

BACKGROUND

In the manufacture of electronic devices, a plasma processing apparatus is used. The plasma processing apparatus has a chamber and a substrate support. The substrate support has a lower electrode and an electrostatic chuck. The electrostatic chuck is provided on the lower electrode. The substrate support supports an edge ring. A substrate is placed in a region surrounded by the edge ring on the substrate support. Radio frequency bias power is supplied to the lower electrode in order to draw ions from plasma into the substrate. Japanese Unexamined Patent Publication No. 2019-36658 discloses such a plasma processing apparatus.

SUMMARY

In an exemplary embodiment, a plasma processing apparatus is provided. The plasma processing apparatus includes a chamber, a substrate support, a first bias power source, a second bias power source, a first circuit, and a second circuit. The substrate support has a first region, a second region, a first electrode, and a second electrode. The first region is configured to support a substrate. The second region is configured to support an edge ring. The first electrode is provided in the first region. The second electrode is provided in the second region and separated from the first electrode. The first bias power source is configured to generate a first electrical bias and electrically connected to the first electrode. The second bias power source is configured to generate a second electrical bias and electrically connected to the second electrode. The first circuit is connected between the first electrode and the first bias power source. The second circuit is connected between the second electrode and the second bias power source. The second circuit has impedance higher than impedance of the first circuit at a common bias frequency of the first electrical bias and the second electrical bias.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

In an exemplary embodiment, a plasma processing apparatus is provided. The plasma processing apparatus includes a chamber, a substrate support, a first bias power source, a second bias power source, a first circuit, and a second circuit. The substrate support has a first region, a second region, a first electrode, and a second electrode. The first region is configured to support a substrate. The second region is configured to support an edge ring. The first electrode is provided in the first region. The second electrode is provided in the second region and separated from the first electrode. The first bias power source is configured to generate a first electrical bias and electrically connected to the first electrode. The second bias power source is configured to generate a second electrical bias and electrically connected to the second electrode. The first circuit is connected between the first electrode and the first bias power source. The second circuit is connected between the second electrode and the second bias power source. The second circuit has impedance higher than impedance of the first circuit at a common bias frequency of the first electrical bias and the second electrical bias.

In the plasma processing apparatus of the above embodiment, the first electrode and the substrate form a first capacitor element. Further, the second electrode and the edge ring form a second capacitor element. An area of the edge ring is generally smaller than an area of the substrate. Therefore, the capacitance of the second capacitor element is lower than the capacitance of the first capacitor element. Therefore, when an electric current that is supplied to the first capacitor element and an electric current that is supplied to the second capacitor element are the same as each other, the voltage waveform of the edge ring changes at higher speed than the voltage waveform of the substrate. In the above embodiment, the first circuit is provided between the first electrode and the first bias power source, and the second circuit is provided between the second electrode and the second bias power source. At the bias frequency, the impedance of the second circuit is higher than the impedance of the first circuit. Therefore, the difference between the voltage waveform of the substrate and the voltage waveform of the edge ring is reduced.

In an exemplary embodiment, the impedance of the first circuit and the impedance of the second circuit are set such that a ratio between an electric current supplied to the substrate and an electric current supplied to the edge ring may be equal to a ratio between an area of the substrate and an area of the edge ring.

In an exemplary embodiment, the plasma processing may further include a controller. The controller may be configured to control the second bias power source to increase a setting level of the second electrical bias according to a decrease in a thickness of the edge ring and controls the second circuit to reduce the impedance of the second circuit according to the decrease in the thickness of the edge ring.

In an exemplary embodiment, each of the first electrical bias and the second electrical bias may be a pulse wave that is periodically generated at a cycle that is defined by the bias frequency. The pulse wave includes a pulse of a negative voltage. The pulse of the negative voltage may be a pulse of a negative direct-current voltage.

In an exemplary embodiment, each of the first electrical bias and the second electrical bias may be radio frequency power having the bias frequency.

In an exemplary embodiment, the first circuit may have a first resistor and a first capacitor. The first resistor is connected between the first electrode and the first bias power source. The first capacitor is connected between a node on an electrical path connecting the first resistor with the first electrode and a ground. The second circuit may have a second resistor and a second capacitor. The second resistor is connected between the second electrode and the second bias power source. The second capacitor is connected between a node on an electrical path connecting the second resistor with the second electrode and a ground. At least one of the second resistor or the second capacitor may be variable.

In an exemplary embodiment, the first circuit may have a first inductor and a first capacitor. The first inductor is connected between the first electrode and the first bias power source. The first capacitor is connected between a node on an electrical path connecting the first inductor with the first electrode and a ground. The second circuit may have a second inductor and a second capacitor. The second inductor is connected between the second electrode and the second bias power source. The second capacitor is connected between a node on an electrical path connecting the second inductor with the second electrode and a ground. At least one of the second inductor or the second capacitor may be variable.

Hereinafter, various exemplary embodiments will be described in detail with reference to the drawings. In the drawings, the same or equivalent portions are denoted by the same reference symbols.

Figure 1:
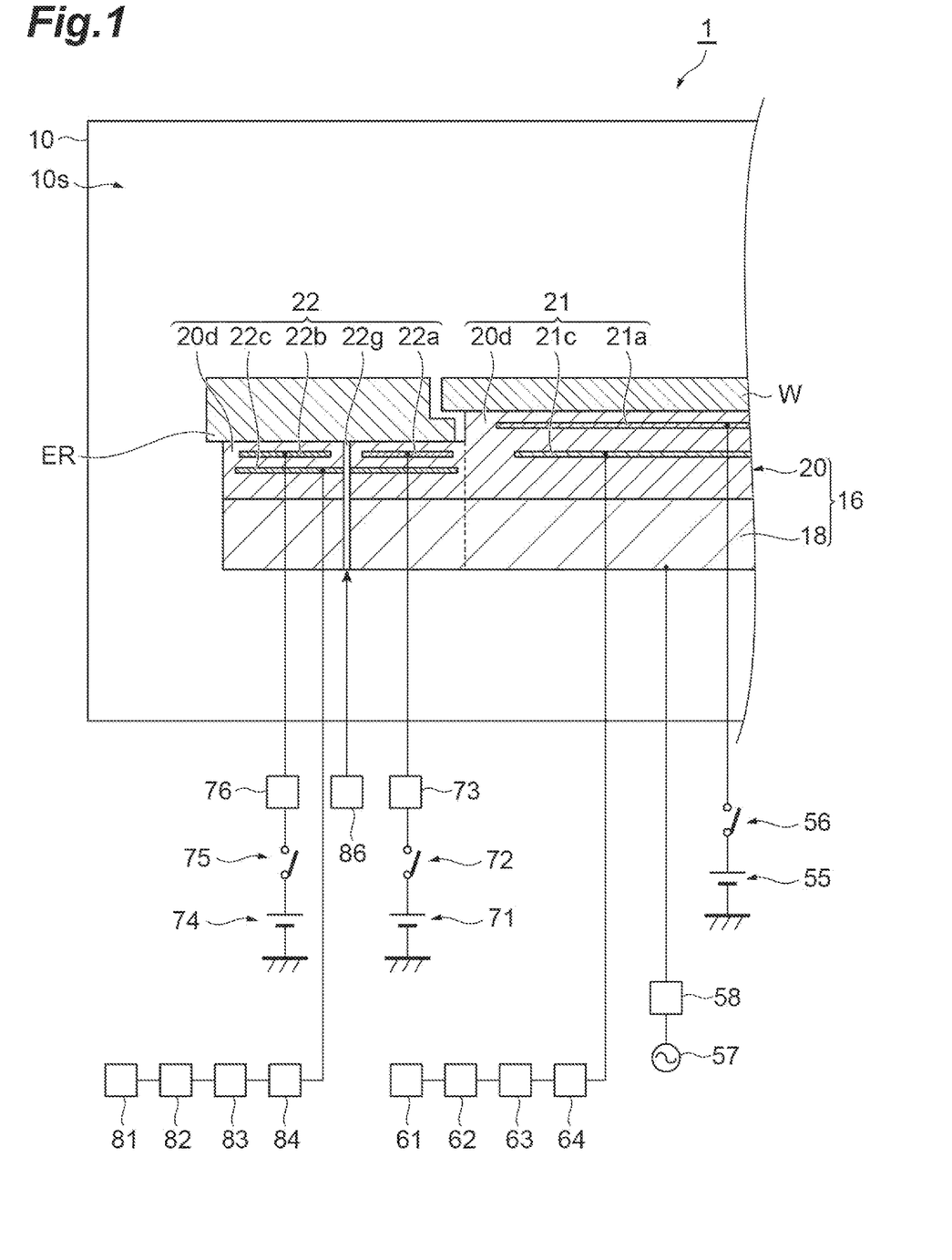
FIG. 1 schematically illustrates a plasma processing apparatus according to an exemplary embodiment.
Figure 2:
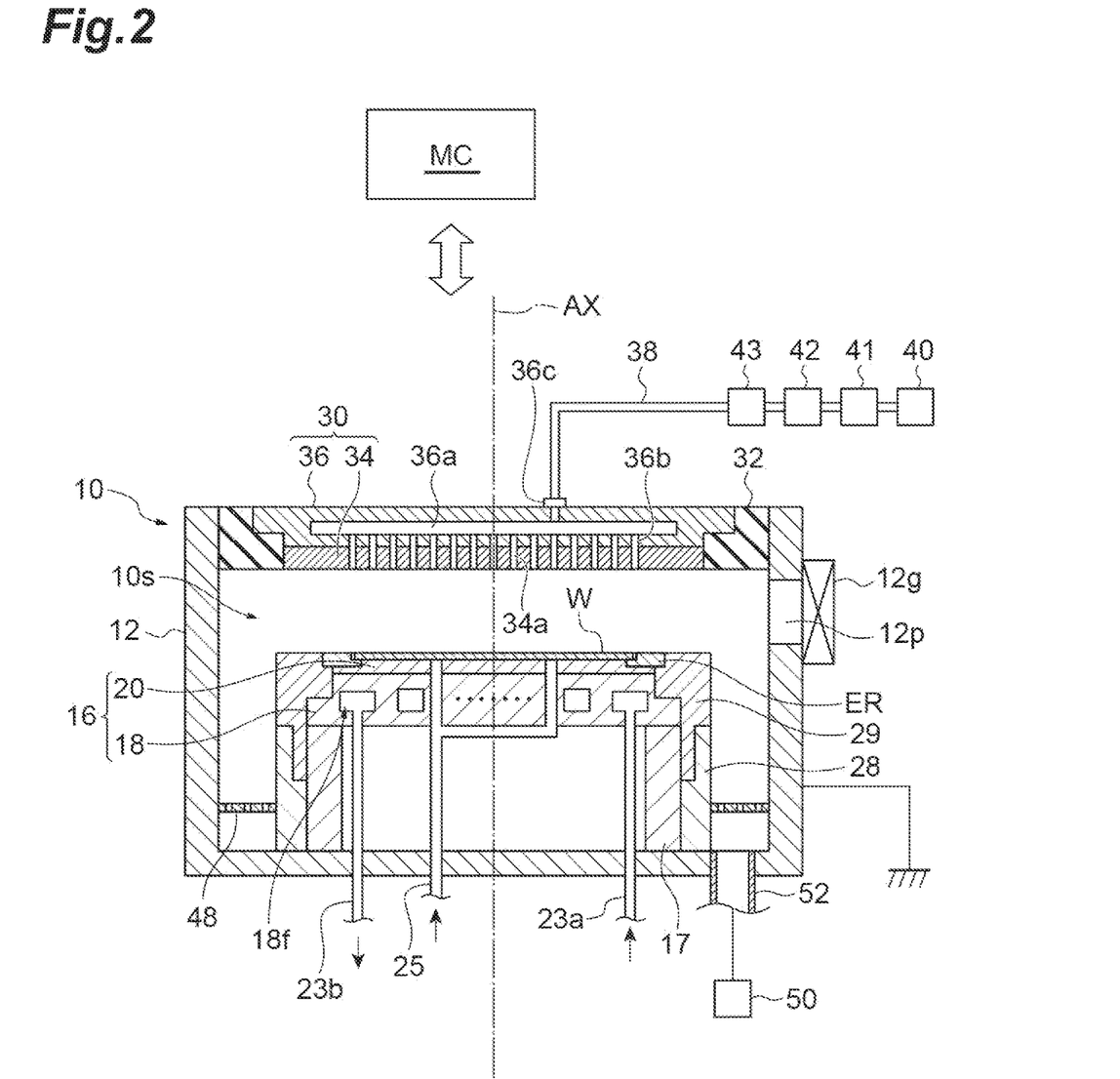
FIG. 2 illustrates a configuration in a chamber of the plasma processing apparatus according to an exemplary embodiment.

FIG. 1 schematically illustrates a plasma processing apparatus according to an exemplary embodiment. A plasma processing apparatus 1 shown in FIG. 1 is provided with a chamber 10. FIG. 2 illustrates the configuration in the chamber of the plasma processing apparatus according to an exemplary embodiment. As shown in FIG. 2, the plasma processing apparatus 1 may be a capacitively coupled plasma processing apparatus.

The chamber 10 provides an internal space 10s therein. The central axis of the internal space 10s is an axis AX which extends in the vertical direction. In an embodiment, the chamber 10 includes a chamber body 12. The chamber body 12 has a substantially cylindrical shape. The internal space 10s is provided in the chamber body 12. The chamber body 12 is formed of, for example, aluminum. The chamber body 12 is electrically grounded. A film having plasma resistance is formed on the inner wall surface of the chamber body 12, that is, the wall surface defining the internal space 10s. This film may be a ceramic film such as a film formed by anodization or a film formed of yttrium oxide.

A passage 12p is formed in a side wall of the chamber body 12. A substrate W passes through the passage 12p when it is transferred between the internal space 10s and the outside of the chamber 10. A gate valve 12g is provided along the side wall of the chamber body 12 for opening and closing of the passage 12p.

The plasma processing apparatus 1 is further provided with a substrate support 16. The substrate support 16 is configured to support the substrate W placed thereon in the chamber 10. The substrate W has a substantially disk shape. The substrate support 16 is supported by a support 17. The support 17 extends upward from a bottom portion of the chamber body 12. The support 17 has a substantially cylindrical shape. The support 17 is formed of an insulating material such as quartz.

The substrate support 16 has a lower electrode 18 and an electrostatic chuck 20. The lower electrode 18 and the electrostatic chuck 20 are provided in the chamber 10. The lower electrode 18 is formed of a conductive material such as aluminum and has a substantially disk shape.

A flow path 18f is formed in the lower electrode 18. The flow path 18f is a flow path for a heat exchange medium. As the heat exchange medium, for example, a liquid refrigerant is used. A supply device for the heat exchange medium (for example, a chiller unit) is connected to the flow path 18f. The supply device is provided outside the chamber 10. The heat exchange medium is supplied from the supply device to the flow path 18f through a pipe 23a. The heat exchange medium supplied to the flow path 18f is returned to the supply device through a pipe 23b.

The electrostatic chuck 20 is provided on the lower electrode 18. As shown in FIG. 1, the electrostatic chuck 20 has a dielectric portion 20d and an electrode 21a. The electrostatic chuck 20 may further has an electrode 22a and an electrode 22b. When the substrate W is processed in the internal space 10s, the substrate W is placed on the electrostatic chuck 20 and is held by the electrostatic chuck 20. Further, an edge ring ER is mounted on the substrate support 16. The edge ring ER is a plate having a substantially ring shape. The edge ring ER has electrical conductivity. The edge ring ER is formed of, for example, silicon or silicon carbide. As shown in FIG. 2, the edge ring ER is mounted on the substrate support 16 such that the central axis thereof coincides with the axis AX. The substrate W accommodated in the chamber 10 is disposed on the electrostatic chuck 20 and in a region surrounded by the edge ring ER.

The plasma processing apparatus 1 may be further provided with a gas line 25. The gas line 25 supplies a heat transfer gas, for example, a He gas, from a gas supply mechanism to a gap between the upper surface of the electrostatic chuck 20 (a first region to be described later) and the rear surface (lower surface) of the substrate W.

The plasma processing apparatus 1 may be further provided with an outer peripheral portion 28 and an outer peripheral portion 29. The outer peripheral portion 28 extends upward from the bottom portion of the chamber body 12. The outer peripheral portion 28 has a substantially cylindrical shape and extends along the outer periphery of the support 17. The outer peripheral portion 28 is formed of a conductive material. The outer peripheral portion 28 is electrically grounded. A film having plasma resistance is formed on the surface of the outer peripheral portion 28. This film may be a ceramic film such as a film formed by anodization or a film formed of yttrium oxide.

The outer peripheral portion 29 is provided on the outer peripheral portion 28. The outer peripheral portion 29 is formed of a material having insulation properties. The outer peripheral portion 29 is formed of ceramic such as quartz, for example. The outer peripheral portion 29 has a substantially cylindrical shape. The outer peripheral portion 29 extends along the outer peripheries of the lower electrode 18 and the electrostatic chuck 20.

The plasma processing apparatus 1 is further provided with an upper electrode 30. The upper electrode 30 is provided above the substrate support 16. The upper electrode 30 closes an upper opening of the chamber body 12 together with a member 32. The member 32 has insulation properties. The upper electrode 30 is supported on an upper portion of the chamber body 12 through the member 32.

The upper electrode 30 includes a ceiling plate 34 and a support 36. The lower surface of the ceiling plate 34 defines the internal space 10s. A plurality of gas discharge holes 34a are formed in the ceiling plate 34. Each of the plurality of gas discharge holes 34a penetrates the ceiling plate 34 in a plate thickness direction (the vertical direction). The ceiling plate 34 is formed of, for example, silicon. Alternatively, the ceiling plate 34 may have a structure in which a plasma-resistant film is provided on the surface of a member made of aluminum. This film may be a ceramic film such as a film formed by anodization or a film formed of yttrium oxide.

The support 36 detachably supports the ceiling plate 34. The support 36 is formed of a conductive material such as aluminum, for example. A gas diffusion chamber 36a is provided in the interior of the support 36. A plurality of gas holes 36b extend downward from the gas diffusion chamber 36a. The plurality of gas holes 36b communicate with the plurality of gas discharge holes 34a, respectively. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply gases from one or more gas sources selected from the plurality of gas sources of the gas source group 40 to the internal space 10s at individually adjusted flow rates.

A baffle plate 48 is provided between the outer peripheral portion 28 and the side wall of the chamber body 12. The baffle plate 48 may be configured, for example, by coating a member made of aluminum with ceramic such as yttrium oxide. A number of through-holes are formed in the baffle plate 48. An exhaust pipe 52 is connected to the bottom portion of the chamber body 12 below the baffle plate 48. An exhaust device 50 is connected to the exhaust pipe 52. The exhaust device 50 has a pressure controller such as an automatic pressure control valve, and a vacuum pump such as a turbo molecular pump, and can reduce the pressure in the internal space 10s.

Hereinafter, the substrate support 16 will be described in detail. As described above, the substrate support 16 has the lower electrode 18 and the electrostatic chuck 20. As shown in FIG. 1, the plasma processing apparatus 1 has a radio frequency power source 57. The radio frequency power source 57 is connected to the lower electrode 18 through a matcher 58. The radio frequency power source 57 is a power source that generates radio frequency power for plasma generation. The radio frequency power generated by the radio frequency power source 57 has a frequency within the range of 27 to 100 MHz, for example, a frequency of 40 MHz or 60 MHz. The matcher 58 has a matching circuit for matching the impedance on the load side (the lower electrode 18 side) of the radio frequency power source 57 with the output impedance of the radio frequency power source 57. The radio frequency power source 57 may not be electrically connected to the lower electrode 18, and may be connected to the upper electrode 30 through the matcher 58.

In the plasma processing apparatus 1, a radio frequency electric field is generated in the chamber 10 by the radio frequency power from the radio frequency power source 57. The gas in the chamber 10 is excited by the generated radio frequency electric field. As a result, plasma is generated in the chamber 10. The substrate W is processed with chemical species such as ions and/or radicals from the generated plasma.

The substrate support 16 has a first region 21 and a second region 22. The first region 21 is a central region of the substrate support 16. The first region 21 includes the central region of the electrostatic chuck 20 and the central region of the lower electrode 18. The second region 22 extends in a circumferential direction on the outside in a radial direction with respect to the first region 21. The second region 22 includes a peripheral edge region of the electrostatic chuck 20 and a peripheral edge region of the lower electrode 18. In the plasma processing apparatus 1, the first region 21 and the second region 22 are configured from a single electrostatic chuck and are integrated with each other. In FIG. 1, the boundary between the first region 21 and the second region 22 is indicated by a broken line. In another embodiment, the first region 21 and the second region 22 may be configured from individual electrostatic chucks.

The first region 21 is configured to support the substrate W placed thereon (that is, on the upper surface thereof). The first region 21 is a region having a disk shape. The central axis of the first region 21 substantially coincides with the axis AX. The first region 21 shares the dielectric portion 20d with the second region 22. The dielectric portion 20d is formed of a dielectric such as aluminum nitride or aluminum oxide. The dielectric portion 20d has a substantially disk shape. In an embodiment, the thickness of the dielectric portion 20d in the second region 22 is smaller than the thickness of the dielectric portion 20d in the first region 21. The position in the vertical direction of the upper surface of the dielectric portion 20d in the second region 22 may be lower than the position in the vertical direction of the upper surface of the dielectric portion 20d in the first region 21.

The first region 21 has the electrode 21a (chuck electrode). The electrode 21a is an electrode having a film shape and is provided in the dielectric portion 20d in the first region 21. A direct-current power source 55 is connected to the electrode 21a through a switch 56. When a direct-current voltage from the direct-current power source 55 is applied to the electrode 21a, an electrostatic attraction force is generated between the first region 21 and the substrate W. Due to the generated electrostatic attraction force, the substrate W is attracted to the first region 21 and held by the first region 21.

The first region 21 further has a first electrode 21c. The first electrode 21c is an electrode having a film shape and is provided in the dielectric portion 20d in the first region 21. The electrode 21a may extend closer to the upper surface of the first region 21 than the first electrode 21c in the vertical direction.

The plasma processing apparatus 1 is further provided with a first bias power source 61. The first bias power source 61 is electrically connected to the first electrode 21c through a first circuit 63. The first bias power source 61 generates a first electrical bias. The first electrical bias is applied to the first electrode 21c. In an embodiment, the first electrical bias is a pulse wave that includes a pulse of a negative direct-current voltage and is periodically generated at a cycle that is defined by a bias frequency. The bias frequency may be a frequency in the range of 200 kHz to 13.56 MHz. The voltage level of the pulse wave may have a voltage value of 0 V or higher in a period other than a period in which the pulse of the negative direct-current voltage continues in the cycle, and the pulse wave may be, for example, a pulse wave having a positive or negative voltage value. Alternatively, the voltage of the pulse wave may have an absolute value lower than the absolute value of the voltage of the pulse in a period other than the period in which the pulse of the negative direct-current voltage continues in the cycle. The voltage level of the pulse may temporally change within the cycle, and the pulse may be a pulse voltage such as a triangular wave or an impulse.

Figure 3:
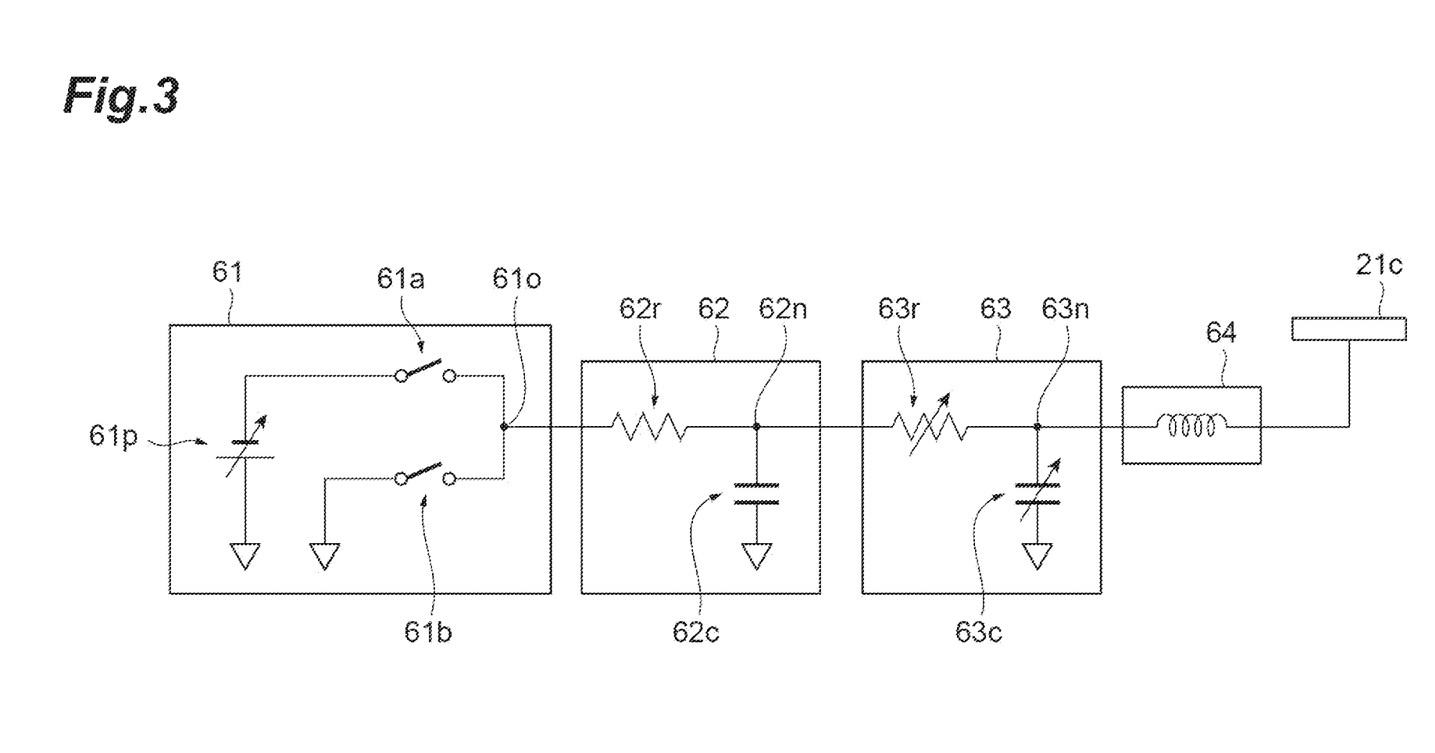
FIG. 3 illustrates a first bias power source, a damping circuit, a first circuit, and a filter in a plasma processing apparatus according to an exemplary embodiment.

FIG. 3 illustrates a first bias power source, a damping circuit, a first circuit, and a filter in a plasma processing apparatus according to an exemplary embodiment. As shown in FIGS. 1 and 3, the plasma processing apparatus 1 may be further provided with a damping circuit 62 and a filter 64. The damping circuit 62 may be connected between the first bias power source 61 and the first circuit 63. The filter 64 may be connected between the first circuit 63 and the first electrode 21c. The first bias power source 61 may be connected to the first circuit 63 without going through the damping circuit 62. In this case, the plasma processing apparatus 1 may not be provided with the damping circuit 62.

As shown in FIG. 3, in an embodiment, the first bias power source 61 includes a variable direct-current power source 61p, a switch 61a, and a switch 61b. The variable direct-current power source 61p is a direct-current power source that generates a negative direct-current voltage. The level of the direct-current voltage that is generated by the variable direct-current power source 61p is variable. The variable direct-current power source 61p is connected to an output 61o through the switch 61a. The output 61o is connected to the ground through the switch 61b. The switch 61a and the switch 61b can be controlled by a controller MC (described later). In a case where the switch 61a is in a conduction state and the switch 61b is in a non-conduction state, a negative direct-current voltage is output from the output 61o. In a case where the switch 61a is in the non-conduction state and the switch 61b is in the conduction state, the voltage level of the output 61o becomes 0 V. A pulse wave, which is the first electrical bias, can be obtained by controlling the conduction state of each of the switch 61a and the switch 61b.

The damping circuit 62 is connected between the output 61o of the first bias power source 61 and the first circuit 63. In an embodiment, the damping circuit 62 has a resistor 62r and a capacitor 62c. One end of the resistor 62r is connected to the output 61o of the first bias power source 61. One end of the capacitor 62c is connected to a node 62n on an electrical path connecting the other end of the resistor 62r with the first circuit 63. The other end of the capacitor 62c is grounded.

The impedance of the first circuit 63 may be variable. The first circuit 63 has one or more variable circuit elements. Each of the one or more variable circuit elements has a variable element parameter. In an embodiment, the first circuit 63 has a first variable resistor 63r and a first variable capacitor 63c as the one or more variable circuit elements. In the first circuit 63, the variable element parameters are the resistance value of the first variable resistor 63r and the capacitance of the first variable capacitor 63c. One end of the first variable resistor 63r is connected to the output 61o of the first bias power source 61 through the damping circuit 62. One end of the first variable capacitor 63c is connected to a node 63n on an electrical path connecting the other end of the first variable resistor 63r with the first electrode 21c. The other end of the first variable capacitor 63c is grounded. The impedance of the first circuit 63 is set by the controller MC. The impedance of the first circuit 63 is controlled by setting the variable element parameter of each of one or more variable circuit elements of the first circuit 63, for example, the resistance value of the first variable resistor 63r and the capacitance of the first variable capacitor 63c, by the controller MC. The impedance of the first circuit 63 may be constant rather than variable. That is, a fixed resistor may be used instead of the first variable resistor 63r, and a fixed capacitor may be used instead of the first variable capacitor 63c.

The filter 64 is connected between the node 63n and the first electrode 21c. The filter 64 is an electric filter configured to block or attenuate the radio frequency power from the radio frequency power source 57. The filter 64 includes, for example, an inductor connected between the node 63n and the first electrode 21c.

As shown in FIG. 1, the second region 22 extends to surround the first region 21. The second region 22 is a substantially annular region. The central axis of the second region 22 substantially coincides with the axis AX. The second region 22 is configured to support the edge ring ER placed thereon (that is, on the upper surface thereof). The second region 22 shares the dielectric portion 20d with the first region 21.

In an embodiment, the second region 22 may hold the edge ring ER by an electrostatic attraction force. In this embodiment, the second region 22 may have one or more electrodes (chuck electrodes). In the embodiment shown in FIG. 1, the second region 22 has a pair of electrodes, that is, the electrode 22a and the electrode 22b. The electrode 22a and the electrode 22b are provided in the dielectric portion 20d in the second region 22. The electrode 22a and the electrode 22b configure a bipolar electrode. Each of the electrode 22a and the electrode 22b is an electrode having a film shape. The electrode 22a and the electrode 22b may extend at substantially the same height position in the vertical direction.

A direct-current power source 71 is connected to the electrode 22a through a switch 72 and a filter 73. The filter 73 is an electric filter configured to block or attenuate the radio frequency power and the first and second electrical biases. A direct-current power source 74 is connected to the electrode 22b through a switch 75 and a filter 76. The filter 76 is an electric filter configured to block or reduce the radio frequency power and the first and second electrical biases.

The direct-current power source 71 and the direct-current power source 74 apply direct-current voltages to the electrodes 22a and 22b, respectively, in order to generate an electrostatic attraction force that attracts the edge ring ER to the second region 22. The setting potential of each of the electrodes 22a and 22b may be any of positive potential, negative potential, and 0 V. For example, the potential of the electrode 22a may be set to positive potential, and the potential of the electrode 22b may be set to negative potential. Further, the potential difference between the electrode 22a and the electrode 22b may be formed by using a single direct-current power source instead of the two direct-current power sources.

When a direct-current voltage is applied to the electrode 22a and the electrode 22b, an electrostatic attraction force is generated between the second region 22 and the edge ring ER. The edge ring ER is attracted to the second region 22 by the generated electrostatic attraction force and held by the second region 22.

The second region 22 further has a second electrode 22c. The second electrode 22c is an electrode having a film shape. The second electrode 22c is provided in the dielectric portion 20d in the second region 22. The second electrode 22c is separated from the first electrode 21c. The electrode 22a and the electrode 22b may extend closer to the upper surface of the second region 22 than the second electrode 22c in the vertical direction. The second electrode 22c may be disposed outside the second region 22. For example, the second electrode 22c may be provided below the edge ring ER and in the outer peripheral portion 29.

The plasma processing apparatus 1 is further provided with a second bias power source 81. The second bias power source 81 is electrically connected to the second electrode 22c through a second circuit 83. The second bias power source 81 generates a second electrical bias. The second electrical bias is applied to the second electrode 22c. In an embodiment, the second electrical bias is a pulse wave that includes a pulse of a negative direct-current voltage and is periodically generated at a cycle that is defined by the bias frequency. The bias frequency of the second electrical bias is the same as the bias frequency of the first electrical bias. The voltage level of the pulse wave may have a voltage value of 0 V or higher in a period other than a period in which the pulse of the negative direct-current voltage continues in the cycle, and the pulse wave may be, for example, a pulse wave having a positive or negative voltage value. Alternatively, the voltage of the pulse wave may have an absolute value lower than the absolute value of the voltage of the pulse in a period other than the period in which the pulse of the negative direct-current voltage continues in the cycle. The voltage level of the pulse may temporally change within the cycle, and the pulse may be a pulse voltage such as a triangular wave or an impulse.

Figure 4:
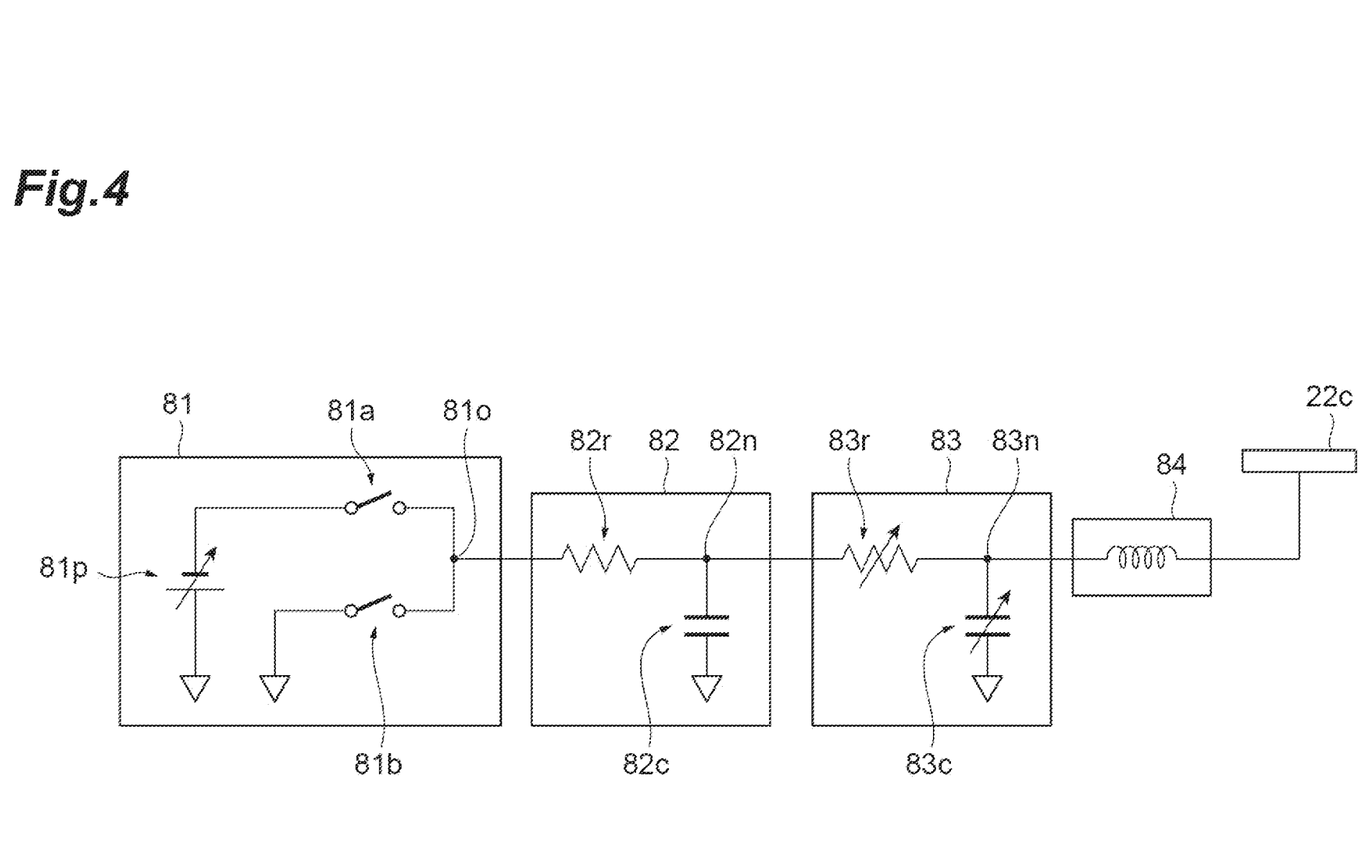
FIG. 4 illustrates a second bias power source, a damping circuit, a second circuit, and a filter in a plasma processing apparatus according to an exemplary embodiment.

FIG. 4 illustrates a second bias power source, a damping circuit, a second circuit, and a filter in a plasma processing apparatus according to an exemplary embodiment. As shown in FIGS. 1 and 4, the plasma processing apparatus 1 may be further provided with a damping circuit 82 and a filter 84. The damping circuit 82 may be connected between the second bias power source 81 and the second circuit 83. The filter 84 may be connected between the second circuit 83 and the second electrode 22c. The second bias power source 81 may be connected to the second circuit 83 without going through the damping circuit 82. In this case, the plasma processing apparatus 1 may not be provided with the damping circuit 82.

As shown in FIG. 4, in an embodiment, the second bias power source 81 includes a variable direct-current power source 81p, a switch 81a, and a switch 81b. The variable direct-current power source 81p is a direct-current power source that generates a negative direct-current voltage. The level of the direct-current voltage that is generated by the variable direct-current power source 81p is variable. The variable direct-current power source 81p is connected to an output 81o through the switch 81a. The output 81o is connected to the ground through the switch 81b. The switch 81a and the switch 81b can be controlled by the controller MC (described later). In a case where the switch 81a is in a conduction state and the switch 81b is in a non-conduction state, a negative direct-current voltage is output from the output 81o. In a case where the switch 81a is in the non-conduction state and the switch 81b is in the conduction state, the voltage level of the output 81o becomes 0 V. A pulse wave, which is the second electrical bias, can be obtained by controlling the conduction state of each of the switch 81a and the switch 81b.

The damping circuit 82 is connected between the output 81o of the second bias power source 81 and the second circuit 83. In an embodiment, the damping circuit 82 has a resistor 82r and a capacitor 82c. One end of the resistor 82r is connected to the output 81o of the second bias power source 81. One end of the capacitor 82c is connected to a node 82n on an electrical path connecting the other end of the resistor 82r with the second circuit 83. The other end of the capacitor 82c is grounded.

The impedance of the second circuit 83 may be variable. The second circuit 83 has one or more variable circuit elements. Each of the one or more variable circuit elements has a variable element parameter. In an embodiment, the second circuit 83 has a second variable resistor 83r and a second variable capacitor 83c as the one or more variable circuit elements. In the second circuit 83, the variable element parameters are the resistance value of the second variable resistor 83r and the capacitance of the second variable capacitor 83c. One end of the second variable resistor 83r is connected to the output 81o of the second bias power source 81 through the damping circuit 82. One end of the second variable capacitor 83c is connected to a node 83n on an electrical path connecting the other end of the second variable resistor 83r with the second electrode 22c. The other end of the second variable capacitor 83c is grounded. The second circuit 83 has impedance higher than the impedance of the first circuit 63 at a common bias frequency of the first electrical bias and the second electrical bias. In an embodiment, the impedance of the first circuit 63 and the impedance of the second circuit 83 are set such that the ratio between an electric current that is supplied to the substrate W and an electric current that is supplied to the edge ring ER is equal to the ratio between an area of the substrate W and an area of the edge ring ER. The impedance of the second circuit 83 is set by the controller MC. The impedance of the second circuit 83 is controlled by setting the variable element parameter of each of one or more variable circuit elements of the second circuit 83, for example, the resistance value of the second variable resistor 83r and the capacitance of the second variable capacitor 83c, by the controller MC. The impedance of the second circuit 83 may be constant rather than variable. That is, a fixed resistor may be used instead of the second variable resistor 83r, and a fixed capacitor may be used instead of the second variable capacitor 83c.

The filter 84 is connected between the node 83n and the second electrode 22c. The filter 84 is an electric filter configured to block or attenuate the radio frequency power from the radio frequency power source 57. The filter 84 includes, for example, an inductor connected between the node 83n and the second electrode 22c.

The second region 22 may further have a gas line 22g. The gas line 22g is a gas line provided for supplying a heat transfer gas, for example, a He gas, to the gap between the second region 22 and the edge ring ER. The gas line 22g is connected to a gas supply mechanism 86 which is a heat transfer gas source.

In an embodiment, as shown in FIG. 2, the plasma processing apparatus 1 is further provided with the controller MC. The controller MC is a computer which includes a processor, a storage device, an input device, a display device, and the like, and controls each part of the plasma processing apparatus 1. Specifically, the controller MC executes a control program stored in the storage device, and controls each part of the plasma processing apparatus 1, based on recipe data stored in the storage device. The process designated by the recipe data is performed in the plasma processing apparatus 1 under the control by the controller MC.

Here, the edge ring ER wears by being exposed to plasma, so that the thickness thereof decreases. In a case where the thickness of the edge ring ER becomes smaller than the initial thickness thereof, the upper end of a sheath (plasma sheath) is inclined in the vicinity of an edge of the substrate W. Therefore, in a case where the thickness of the edge ring ER becomes smaller than the initial thickness thereof, an incident direction of ions with respect to the edge of the substrate W is inclined with respect to the vertical direction. In an embodiment, the controller MC may control the second bias power source 81 to increase the setting level of the second electrical bias according to a decrease in the thickness of the edge ring ER. In a case where the second electrical bias is the pulse wave described above, the setting level of the second electrical bias is the absolute value of the voltage of the pulse in the pulse wave. When the setting level of the second electrical bias is increased, the thickness of the sheath increases above the edge ring ER, so that the inclination of the incident direction of the ions with respect to the edge of the substrate W can be corrected.

The controller MC may specify the setting level of the second electrical bias corresponding to the thickness of the edge ring ER by using a function or a table stored in the storage device thereof. The thickness of the edge ring ER may be measured optically or electrically, or may be estimated from a time in which the edge ring ER is exposed to plasma.

Further, the controller MC may control the variable element parameter of each of the one or more variable circuit elements of the second circuit 83 to reduce the impedance of the second circuit 83 according to the decrease in the thickness of the edge ring ER. The impedance of the second circuit 83 is reduced according to an increase in the setting level of the second electrical bias, whereby an increase in a time length that is required to reach a peak level from a base level in the voltage waveform of the edge ring ER is suppressed.

In an embodiment, the controller MC may specify the variable element parameter of each of the one or more variable circuit elements of the second circuit 83 corresponding to the setting level of the second electrical bias by using a function or a table stored in the storage device thereof. The variable element parameter of each of the one or more variable circuit elements of the second circuit 83 corresponding to the thickness of the edge ring ER may be directly associated with the thickness of the edge ring ER.

In the plasma processing apparatus 1, the first electrode 21c and the substrate W form a first capacitor element. Further, the second electrode 22c and the edge ring ER form a second capacitor element. The region of the edge ring ER is smaller than the region of the substrate W. Therefore, the capacitance of the second capacitor element is lower than the capacitance of the first capacitor element. Therefore, when an electric current that is supplied to the first capacitor element and an electric current that is supplied to the second capacitor element are the same as each other, the voltage waveform of the edge ring ER changes at a higher speed than the voltage waveform of the substrate W. In the plasma processing apparatus 1, the first circuit 63 is provided between the first electrode 21c and the first bias power source 61, and the second circuit 83 is provided between the second electrode 22c and the second bias power source 81. At the bias frequency, the impedance of the second circuit 83 is set to impedance higher than the impedance of the first circuit 63. Therefore, according to the plasma processing apparatus 1, the difference between the voltage waveform of the substrate W and the voltage waveform of the edge ring ER is reduced.

Figure 5A:
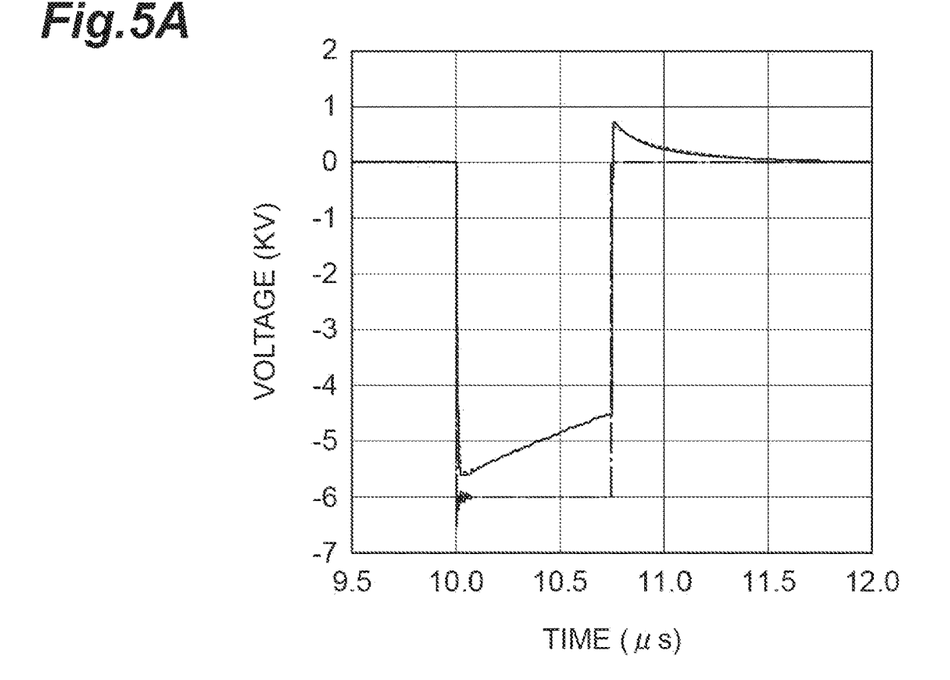
FIG. 5A is a diagram showing simulation results of voltage waveforms in the plasma processing apparatus shown in FIG. 1.
Figure 5B:
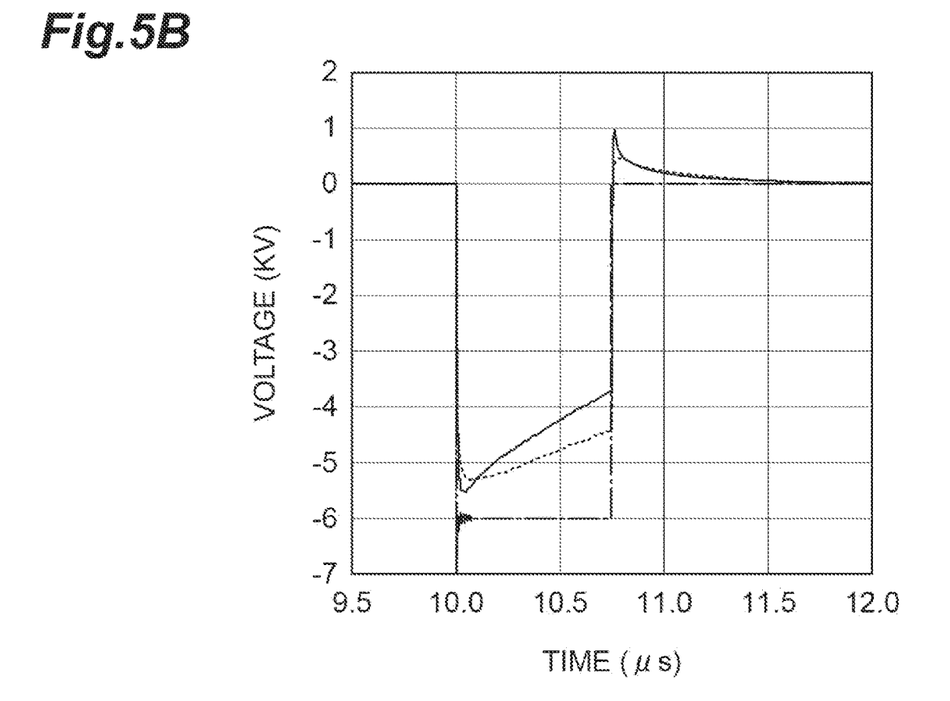
FIG. 5B is a diagram showing simulation results of voltage waveforms in a plasma processing apparatus of a comparative example.

Hereinafter, FIGS. 5A and 5B will be referred to. FIG. 5A is a diagram showing simulation results of voltage waveforms in the plasma processing apparatus shown in FIG. 1. FIG. 5B is a diagram showing simulation results of voltage waveforms in a plasma processing apparatus of a comparative example. The plasma processing apparatus of the comparative example is a plasma processing apparatus in which the first circuit 63 and the second circuit 83 are removed from the plasma processing apparatus 1. In each of FIGS. 5A and 5B, the horizontal axis represents time and the vertical axis represents voltage. In each of FIGS. 5A and 5B, the waveform of the output voltage (the second electrical bias) of the second bias power source 81, the voltage waveform of the edge ring ER, and the voltage waveform of the substrate W are respectively indicated by a dashed-dotted line, a solid line, and a broken line. As shown in FIG. 5B, in the plasma processing apparatus of the comparative example which does not have the first circuit 63 and the second circuit 83, a difference occurs between the voltage waveform of the substrate W and the voltage waveform of the edge ring ER. On the other hand, as shown in FIG. 5A, in the plasma processing apparatus 1, the difference between the voltage waveform of the substrate W and the voltage waveform of the edge ring ER is reduced.

Figure 6:
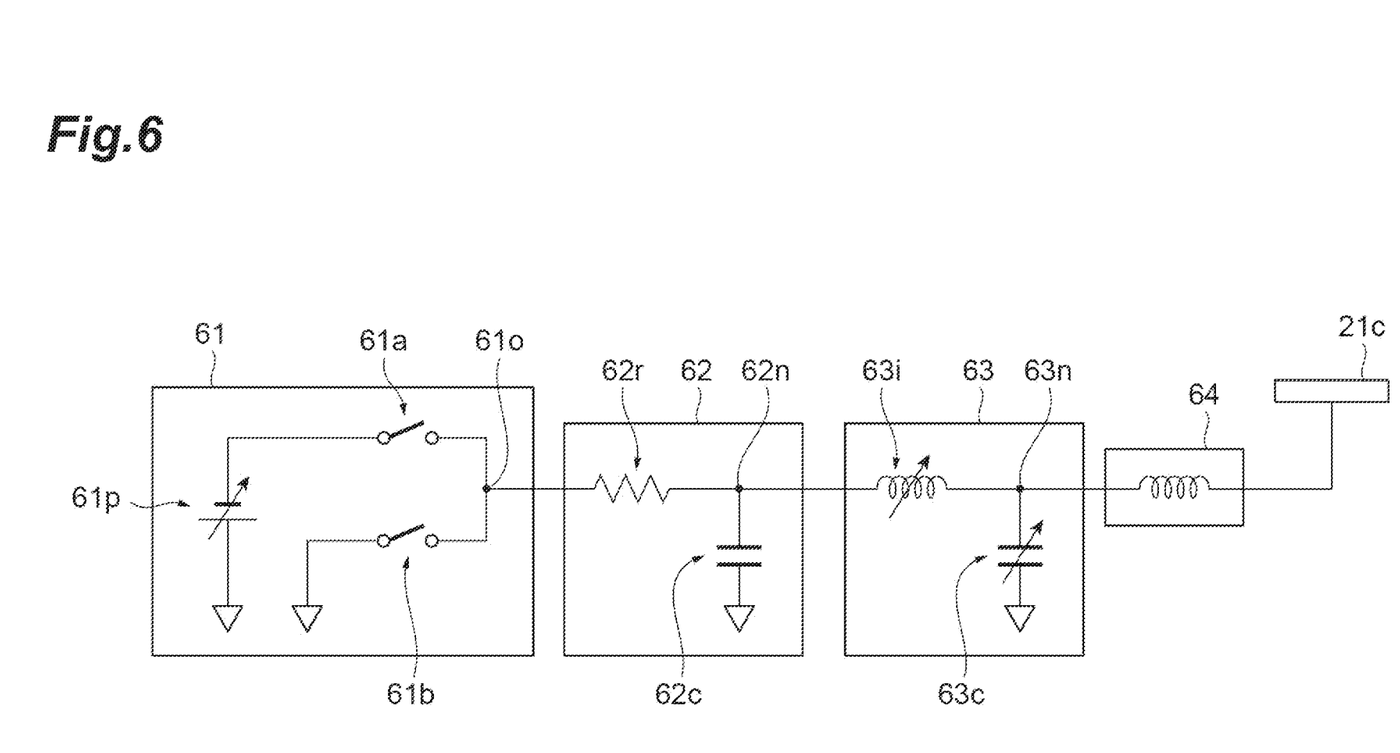
FIG. 6 illustrates a first bias power source, a damping circuit, a first circuit, and a filter in a plasma processing apparatus according to an exemplary embodiment.
Figure 7:
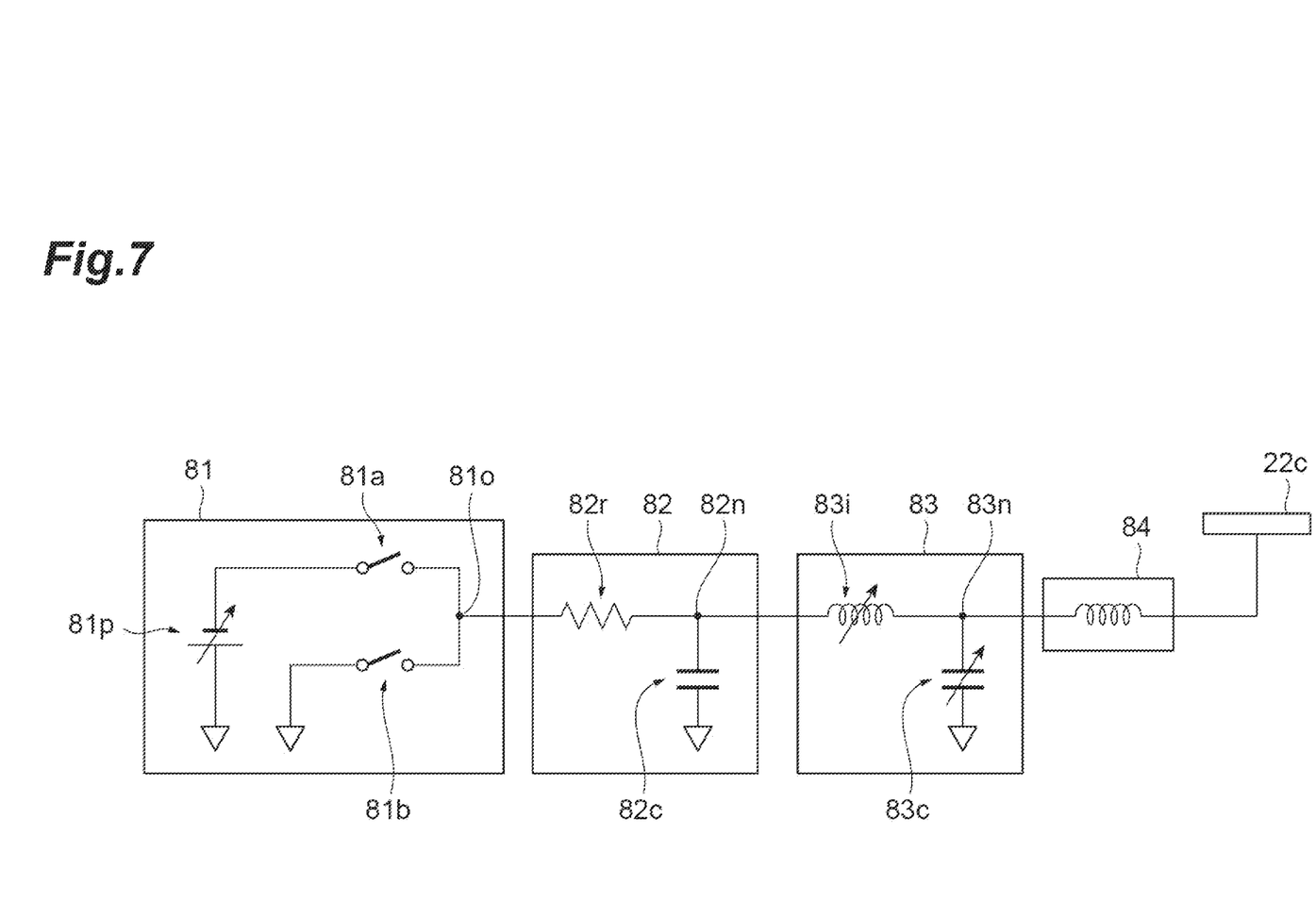
FIG. 7 illustrates a second bias power source, a damping circuit, a second circuit, and a filter in a plasma processing apparatus according to an exemplary embodiment.

Hereinafter, FIGS. 6 and 7 will be referred to. FIG. 6 illustrates a first bias power source, a damping circuit, a first circuit, and a filter in a plasma processing apparatus according to an exemplary embodiment. FIG. 7 illustrates a second bias power source, a damping circuit, a second circuit, and a filter in a plasma processing apparatus according to an exemplary embodiment. As shown in FIG. 6, the first circuit 63 may have a first variable inductor 63i instead of the first variable resistor 63r. Further, as shown in FIG. 7, the second circuit 83 may have a second variable inductor 83i instead of the second variable resistor 83r. Although the example in which the first circuit and the second circuit include the variable elements is shown, the first circuit and/or the second circuit may not include the variable element.

Figure 8:
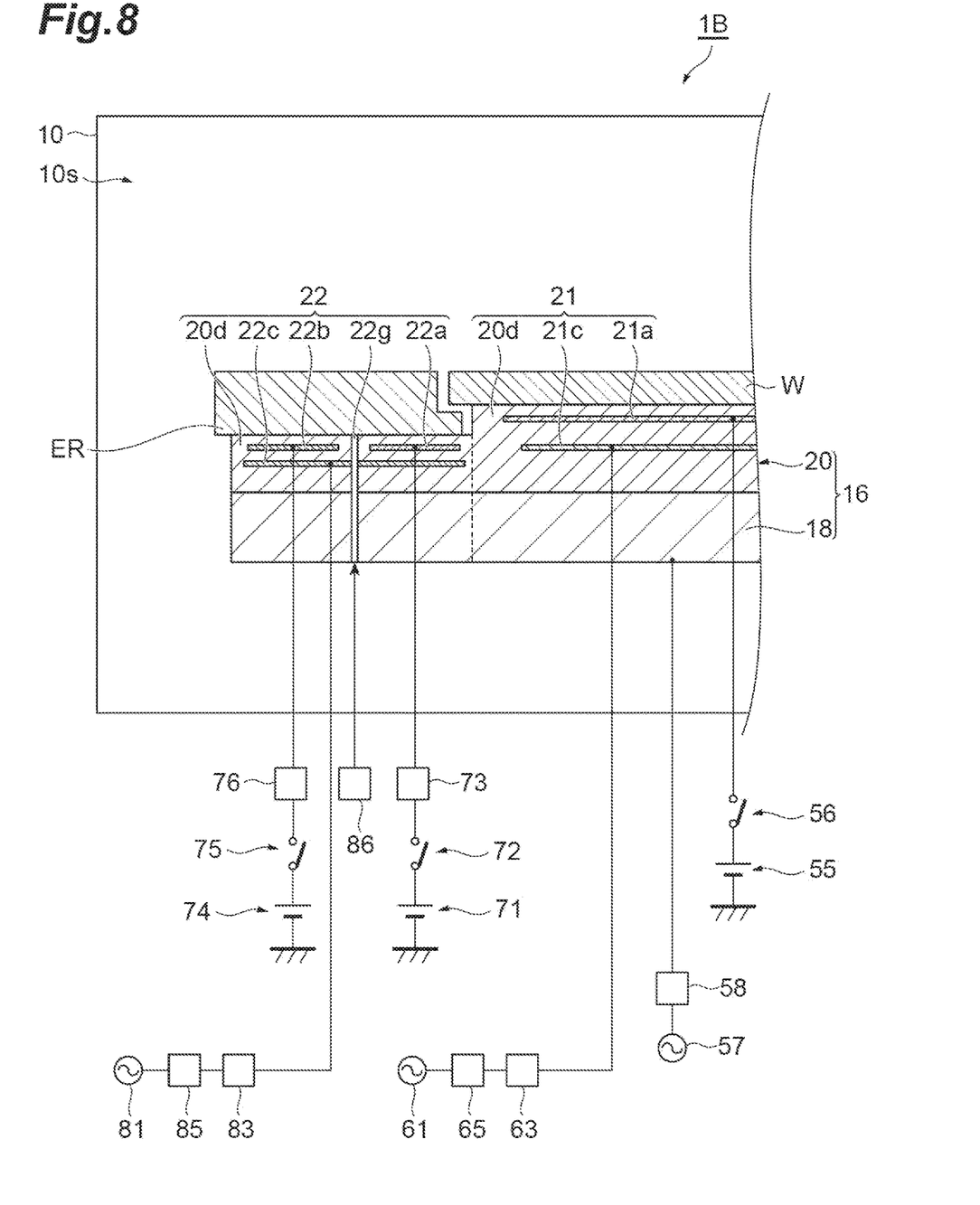
FIG. 8 schematically illustrates a plasma processing apparatus according to another exemplary embodiment.

Hereinafter, FIG. 8 will be referred to. FIG. 8 schematically illustrates a plasma processing apparatus according to another exemplary embodiment. A plasma processing apparatus 1B shown in FIG. 8 includes a radio frequency bias power source as the first bias power source 61. The plasma processing apparatus 1B includes a radio frequency bias power source as the second bias power source 81. In the plasma processing apparatus 1B, the first bias power source 61 is configured to generate radio frequency bias power having a bias frequency as the first electrical bias. The bias frequency is a frequency within the range of 200 kHz to 13.56 MHz, and is, for example, 400 kHz. In the plasma processing apparatus 1B, the first bias power source 61 is connected to the first electrode 21c through a matcher 65 and the first circuit 63. The matcher 65 has a matching circuit for matching the impedance on the load side of the first bias power source 61 with the output impedance of the first bias power source 61.

Further, in the plasma processing apparatus 1B, the second bias power source 81 is configured to generate radio frequency bias power having a bias frequency as the second electrical bias. The bias frequency of the radio frequency bias power that is generated by the second bias power source 81 is the same as the bias frequency of the radio frequency bias power that is generated by the first bias power source 61. Further, in the plasma processing apparatus 1B, the second bias power source 81 is connected to the second electrode 22c through a matcher 85 and the second circuit 83. The matcher 85 has a matching circuit for matching the impedance on the load side of the second bias power source 81 with the output impedance of the second bias power source 81. In the plasma processing apparatus 1B, the setting level of the second electrical bias that is controlled by the controller MC is a power level of the radio frequency bias power. Other configurations of the plasma processing apparatus 1B may be the same as the corresponding configurations of the plasma processing apparatus 1.

Figure 9:
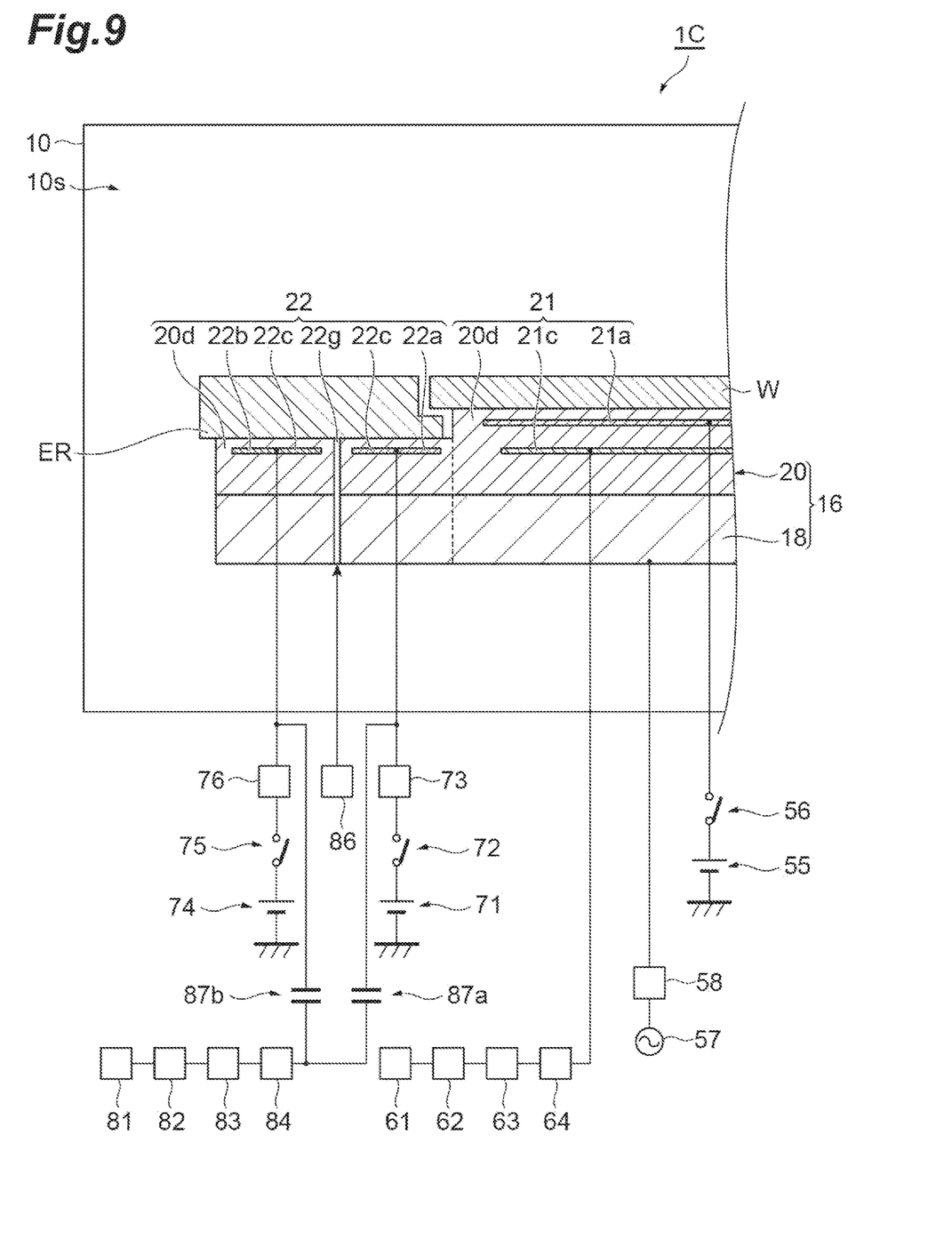
FIG. 9 schematically illustrates a plasma processing apparatus according to still another exemplary embodiment.

Hereinafter, FIG. 9 will be referred to. FIG. 9 schematically illustrates a plasma processing apparatus according to still another exemplary embodiment. In a plasma processing apparatus 1C shown in FIG. 9, the electrode 22a and the electrode 22b are used as the second electrode 22c. The electrical path extending from the output of the second bias power source 81 is branched into two branch paths in a subsequent stage of the second circuit 83 (or the filter 84), and the two branch paths are respectively connected to the electrode 22a and the electrode 22b through blocking capacitors 87a and 87b. Other configurations of the plasma processing apparatus 1C may be the same as the corresponding configurations of the plasma processing apparatus 1. Also in the plasma processing apparatus 1B, similar to the plasma processing apparatus 1C, the electrodes 22a and 22b may be used as the second electrode to which the second electrical bias is applied, and the second electrode 22c separate from the electrodes 22a and 22b may be omitted.

While various exemplary embodiments have been described above, various additions, omissions, substitutions and changes may be made without being limited to the exemplary embodiments described above. Elements of the different embodiments may be combined to form another embodiment.

For example, in another embodiment, the plasma processing apparatus may be a capacitively coupled plasma processing apparatus different from the plasma processing apparatus 1. In another embodiment, the plasma processing apparatus may be another type of plasma processing apparatus. The other type of plasma processing apparatus may be an inductively coupled plasma processing apparatus, an electron cyclotron resonance (ECR) plasma processing apparatus, or a plasma processing apparatus that generates plasma by using surface waves such as microwaves.

Further, the first electrode 21c and the second electrode 22c may not be provided in the dielectric portion 20d of the electrostatic chuck 20. Each of the first electrode 21c and the second electrode 22c may be provided in another dielectric portion provided between the electrostatic chuck 20 and the lower electrode 18.

Further, each of the one or more variable circuit elements in each of the first circuit 63 and the second circuit 83 is not a single variable circuit element, but may be configured with an array of a plurality of fixed circuit elements and a plurality of switching elements respectively connected to the plurality of fixed circuit elements. In this case, the number of fixed circuit elements that are connected in parallel is adjusted by controlling the plurality of switching elements.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a chamber;
a substrate support provided in the chamber and having an electrostatic chuck, a first region including a central region of the electrostatic chuck and configured to support a substrate disposed thereon, a second region including a peripheral region of the electrostatic chuck and configured to support an edge ring disposed thereon, a first electrode provided in the electrostatic chuck in the first region, and a second electrode provided in the electrostatic chuck in the second region and separated from the first electrode, the second region being configured to support an edge ring provided above the second electrode;
a first bias power source electrically connected to the first electrode without being connected to the second electrode and configured to periodically output a first electrical bias having a common bias frequency to the first electrode;
a second bias power source electrically connected to the second electrode without being electrically connected to the first electrode and configured to periodically output a second electrical bias having the common bias frequency to the second electrode, each of the first electrical bias and the second electrical bias being a pulse wave that includes a pulse of a voltage and is periodically generated at a cycle that is defined by the common bias frequency;
a first circuit connected between the first electrode and the first bias power source and having a first impedance which is an impedance at the common bias frequency at a load side of the first bias power source; and
a second circuit connected between the second electrode and the second bias power source and having a second impedance which is an impedance at the common bias frequency at a load side of the second bias power source, the second impedance being higher than the first impedance to reduce difference between a voltage waveform of the substrate disposed on the first region and a voltage waveform of the edge ring disposed on the second region.

2. The plasma processing apparatus according to claim 1, wherein the first impedance of the first circuit and the second impedance of the second circuit are set such that a ratio between an electric current supplied to the substrate in response to the first electrical bias and an electric current supplied to the edge ring in response to the second electrical bias is equal to a ratio between an area of the substrate and an area of the edge ring.

3. The plasma processing apparatus according to claim 1, further comprising:
a controller configured to control the second bias power source and the second circuit,
wherein the controller is configured to control the second bias power source to increase a setting level of the second electrical bias according to a decrease in a thickness of the edge ring and control the second circuit to reduce the second impedance of the second circuit according to the decrease in the thickness of the edge ring.

4. The plasma processing apparatus according to claim 2, further comprising:
a controller configured to control the second bias power source and the second circuit,
wherein the controller is configured to control the second bias power source to increase a setting level of the second electrical bias according to a decrease in a thickness of the edge ring and control the second circuit to reduce the second impedance of the second circuit according to the decrease in the thickness of the edge ring.

5. The plasma processing apparatus according to claim 1, wherein the pulse of the voltage is a pulse of a negative voltage.

6. The plasma processing apparatus according to claim 5, wherein the pulse of the negative voltage is a pulse of a negative direct-current voltage.

7. The plasma processing apparatus according to claim 1, wherein each of the first electrical bias and the second electrical bias is radio frequency power having the bias frequency.

8. The plasma processing apparatus according to claim 1, wherein
the first circuit has
a first resistor connected between the first electrode and the first bias power source, and
a first capacitor connected between a node on an electrical path connecting the first resistor with the first electrode and a ground, and
the second circuit has
a second resistor connected between the second electrode and the second bias power source, and
a second capacitor connected between a node on an electrical path connecting the second resistor with the second electrode and a ground.

9. The plasma processing apparatus according to claim 8, wherein at least one of the second resistor or the second capacitor is variable.

10. The plasma processing apparatus according to claim 5, wherein
the first circuit has
a first resistor connected between the first electrode and the first bias power source, and
a first capacitor connected between a node on an electrical path connecting the first resistor with the first electrode and a ground, and
the second circuit has
a second resistor connected between the second electrode and the second bias power source, and
a second capacitor connected between a node on an electrical path connecting the second resistor with the second electrode and a ground.

11. The plasma processing apparatus according to claim 10, wherein at least one of the second resistor or the second capacitor is variable.

12. The plasma processing apparatus according to claim 1, wherein
the first circuit has
a first inductor connected between the first electrode and the first bias power source, and
a first capacitor connected between a node on an electrical path connecting the first inductor with the first electrode and a ground, and
the second circuit has
a second inductor connected between the second electrode and the second bias power source, and
a second capacitor connected between a node on an electrical path connecting the second inductor with the second electrode and a ground.

13. The plasma processing apparatus according to claim 12, wherein at least one of the second inductor or the second capacitor is variable.

14. The plasma processing apparatus according to claim 5, wherein
the first circuit has
a first inductor connected between the first electrode and the first bias power source, and
a first capacitor connected between a node on an electrical path connecting the first inductor with the first electrode and a ground, and
the second circuit has
a second inductor connected between the second electrode and the second bias power source, and
a second capacitor connected between a node on an electrical path connecting the second inductor with the second electrode and a ground.

15. The plasma processing apparatus according to claim 14, wherein at least one of the second inductor or the second capacitor is variable.

16. The plasma processing apparatus according to claim 6, wherein the common bias frequency is a frequency in a range of 200 kHz to 13.56 MHz.

17. The plasma processing apparatus according to claim 6, wherein a voltage level of the pulse wave is 0 V in a period other than a period in which the pulse of the negative direct-current voltage continues in the cycle.

18. The plasma processing apparatus according to claim 6, wherein a voltage of the pulse wave has an absolute value lower than an absolute value of the voltage of the pulse in a period other than the period in which the pulse of the negative direct-current voltage continues in the cycle.

19. The plasma processing apparatus according to claim 6, wherein a voltage level of the pulse temporally changes within the cycle.

20. The plasma processing apparatus according to claim 1, wherein the common bias frequency is a frequency in a range of 200 kHz to 13.56 MHz.

* * * * *